(12) United States Patent
Zhu et al.

(10) Patent No.: US 12,429,401 B2
(45) Date of Patent: Sep. 30, 2025

(54) TUNABLE IN-POOL WAVEGUIDE AND METHOD

(71) Applicant: Intel Corporation, Santa Clara, CA (US)

(72) Inventors: Difeng Zhu, San Diego, CA (US); Razi Dehghannasiri, Albuquerque, NM (US); David Mathine, Albuquerque, NM (US); Eveline Rigo, Tijeras, NM (US)

(73) Assignee: Intel Corporation, Santa Clara, CA (US)

( * ) Notice: Subject to any disclaimer, the term of this patent is extended or adjusted under 35 U.S.C. 154(b) by 866 days.

(21) Appl. No.: 17/475,676

(22) Filed: Sep. 15, 2021

(65) Prior Publication Data

US 2023/0082670 A1    Mar. 16, 2023

(51) Int. Cl.
*G02B 6/122* (2006.01)
*G01M 11/00* (2006.01)
*G02B 6/12* (2006.01)

(52) U.S. Cl.
CPC .......... *G01M 11/30* (2013.01); *G02B 6/1223* (2013.01); *G02B 2006/12061* (2013.01); *G02B 2006/12147* (2013.01)

(58) Field of Classification Search
CPC .................................................. G02B 6/1223
See application file for complete search history.

(56) References Cited

U.S. PATENT DOCUMENTS

| 5,653,008 | A   | * | 8/1997  | Sim ........................ G02F 1/011 |
|           |     |   |         | 385/16 |
| 6,618,536 | B1  | * | 9/2003  | Heideman .......... G01N 21/7703 |
|           |     |   |         | 385/132 |
| 7,386,198 | B2  |   | 6/2008  | Ohmori et al. |
| 2004/0057667 | A1 | * | 3/2004 | Yamada ................. G02B 6/305 |
|           |     |   |         | 385/50 |
| 2008/0080804 | A1 |   | 4/2008 | Kim et al. |
| 2009/0032831 | A1 | * | 2/2009 | Akiyama ............. G02B 6/1347 |
|           |     |   |         | 257/E33.068 |
| 2019/0370652 | A1 | * | 12/2019 | Shen ....................... G06E 3/006 |

FOREIGN PATENT DOCUMENTS

| JP | H0659293  | A | * | 3/1994 |
| JP | H10227930 | A | * | 8/1998 |
| JP | 2002156540 | A | * | 5/2002 |
| JP | 2002323633 | A | * | 11/2002 |

(Continued)

OTHER PUBLICATIONS

JPH0659293A English translation (Year: 1994).*

(Continued)

*Primary Examiner* — Charlie Y Peng
(74) *Attorney, Agent, or Firm* — Finch & Maloney PLLC

(57) ABSTRACT

A photonics integrated circuit includes a first waveguide and a second waveguide. A portion of the first waveguide has a first cladding with a first refractive index. The second waveguide includes a second cladding with a second refractive index different from the first refractive index. Also disclosed is a test circuit for a photonics integrated circuit. The test circuit can be used to determine waveguide losses, and used to tune the waveguide losses.

18 Claims, 8 Drawing Sheets

(56) References Cited

FOREIGN PATENT DOCUMENTS

JP          3627052 B1 *  3/2005
WO      2019130020 A1     7/2019

OTHER PUBLICATIONS

JP_H10227930_A English translation (Year: 1998).*
JP-2002156540-A English translation (Year: 2002).*
JP-2002323633-A English translation (Year: 2002).*
Sun, Xiaochen et al., "Si Photonics for Practical LiDAR Solutions," Applied Sciences 9, 2245, pp. 1-25 (Oct. 10, 2019).
Stankovic, S. et al., "Silicon Photonic Waveguides for Near- and Mid-Infrared Regions," Acta Physica Polonica A, vol. 112, No. 5, pp. 1019-1024. (2007).

* cited by examiner

TUNABLE IN-POOL WAVEGUIDE AND METHOD

BACKGROUND

An optical waveguide is a structure that guides electromagnetic waves in the optical spectrum. Examples of some waveguides include optical fibers and transparent dielectric waveguides made of plastic or glass. Optical waveguides can be used with components in a photonics integrated circuit (PIC). Waveguides can be classified according to geometry (e.g., planar, strip, or fiber), mode structure (e.g., single-mode or multi-mode), refractive index distribution (e.g., step or gradient index), and material (e.g., glass, polymer, semiconductor).

In photonics applications, waveguides can be designed for single-mode propagation of light at desired wavelengths. Such waveguides can deliver an optical signal with very low signal loss. One type of waveguide is a multi-mode interference coupler (MMI). Light traveling through the MMI is split or combined in a predictable way, such as a 50-50 splitter. Light propagates through the MMI in multiple modes while also experiencing reflection, interference, and optical losses.

Light detecting and ranging (LiDAR) is a technology useful for determining the distance to an object. For example, a LiDAR device targets an object with a laser and measures the time for reflected light to return to a receiver. LiDAR can use light in the ultraviolet, visible, and near infrared light wavelengths, depending on the object of interest. LiDAR can also be used to make high resolution maps of the earth's surface and ocean floor, as well as many other distance-measuring applications.

Figure 1:
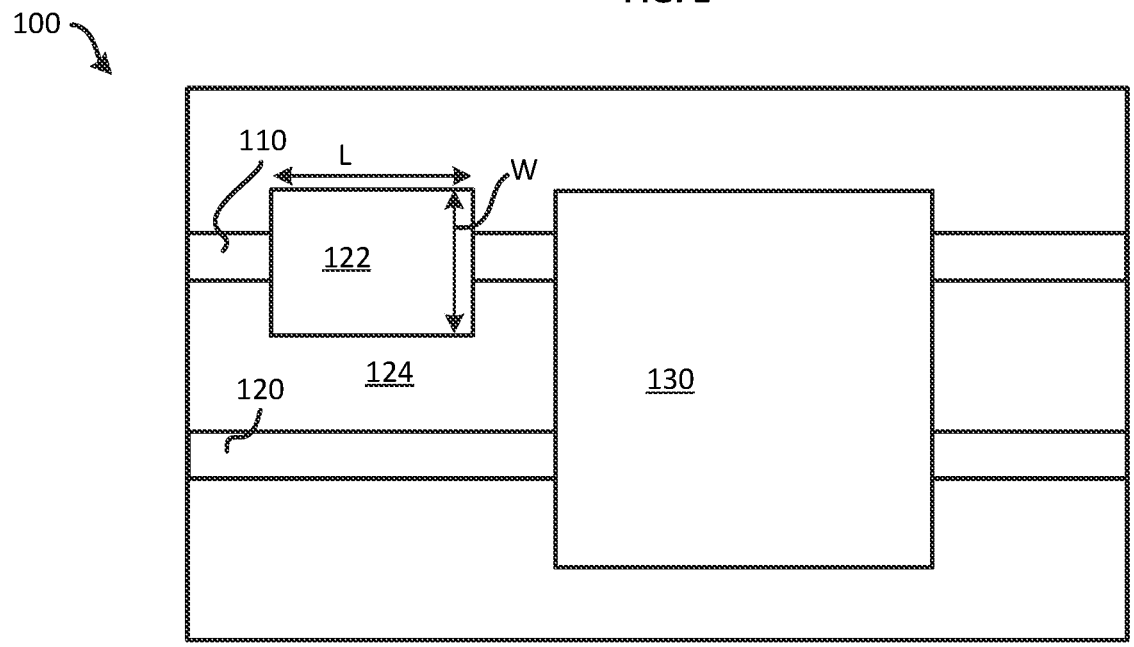
FIG. 1 is a top view of a tunable waveguide structure that includes a multimode coupler, in accordance with an embodiment of the present disclosure.

The figures depict various embodiments of the present disclosure for purposes of illustration only. Numerous variations, configurations, and other embodiments will be apparent from the following detailed discussion. Note that the figures are not necessarily drawn to scale or intended to limit the present disclosure to the specific configurations shown. For instance, while some figures generally indicate perfectly straight lines, right angles, and smooth surfaces, an actual implementation of a photonics integrated circuit structure may have less than perfect straight lines, right angles, and some features may have surface topology or otherwise be non-smooth, given real world limitations of the processing equipment and techniques used. Likewise, while the thickness of a given first layer may appear to be similar in thickness to a second layer, in actuality that first layer may be much thinner or thicker than the second layer; the same goes for other layer or feature dimensions.

DETAILED DESCRIPTION

Disclosed is a tunable waveguide, structure, and methodologies for waveguide loss tuning and fabrication. In accordance with one embodiment, a photonics integrated circuit (PIC) has a first waveguide with a first cladding of a first refractive index. A second waveguide has a second cladding of a second refractive index that is different from the first refractive index. For example, the first and second claddings are oxides of the same or similar chemical composition (e.g., $SiO_x$) but have differences in material density or crystalline structure that result in a difference in the refractive indices of the two claddings. When analyzed using scanning electron microscopy (SEM) or transmission electron microscopy (TEM), for example, the two claddings are visually perceptible due to having different contrast. The first and second waveguides can be part of a PIC, such as being coupled to a multimode interferometer (MMI) or coupled to respective photodetectors.

Also disclosed is a waveguide test structure that includes a plurality of waveguide paths of different path lengths. For example, each waveguide path includes a spiral. In one such embodiment, spirals of the test structure are within a pool region that includes a first cladding material covering the spirals in the pool region. Waveguide losses can be determined based on differences in light propagation through various waveguide paths of the test structure. The test structure can be identified by visual inspection looking at the top of a PIC using an optical microscope, for example.

General Overview

Waveguide (WG) loss tuning capability is an important aspect of silicon photonic integrated circuits. A photonic integrated circuit (PIC) including, or designed to include, a modulator is one existing approach to realize in-situ WG loss tuning. Existing approaches use a change in power supplied to the modulator to affect the refractive index of the cladding. This approach is costly, and the modulator consumes valuable space on the chip. Also, existing approaches do not integrate the traditional modulator in the III-V pool region for the in-pool WG loss tuning. Waveguide loss tuning is important, especially in high-volume manufacturing processes of PIC products.

Optical modulators have been used with waveguides. However, existing approaches do not allow for tuning in-pool waveguides. Also, some PIR products do not require a modulator for its modulation function, but nevertheless include a modulator for WG loss tuning capability, such as in LiDAR applications. However, integrating a modulator into a photonics integrated circuit can have high cost due to complex design, process integration requirements, and the modulator consuming valuable space on the integrated circuit.

Thus, a need exists for an in-pool WG loss tuning device. Additionally, it would be desirable to have a waveguide tuning option that does not require a space-consuming modulator. The present disclosure addresses this need and others by integrating a WG cladding (e.g., a hardmask oxide) into LiDAR process flows. Tuning the WG can be performed at different stages of fabrication, resulting in improved flexibility. For example, tuning can be performed during mask development of processing, during the middle of fabrication process before bonding a semiconductor die with Group III-V material, or after dicing a wafer into individual dies. For example, WG loss tuning according to the present disclosure can be used to compensate for process variation, to improve PIC product yield, and to adjust MMI split ratio or the common mode rejection ratio (CMRR) of a photodetector (PD) in post-fabrication loss tuning. Example PICs that may benefit from tuning structures and methodologies of the present disclosure include a tunable multimode interference coupler ("MMI") and a photodetector of III-V semiconductor material for use in LiDAR.

In accordance with some embodiments of the present disclosure, an in-pool WG tuning approach can be detected by the presence of two different in-pool WG oxide claddings on a single wafer or die, which is unlike the single oxide cladding observed in traditional approaches. The presence of two oxide claddings can be seen using scanning electron microscopy (SEM) or transmission electron microscopy (TEM), in which the two oxides exhibit different contrast due to having different refractive indices. In some embodiments, an in-pool WG spiral test structure, which can be used for loss feedback, can be observed in a top view of a die. The presence of the spiral test structure is indicative of the WG tuning structures and methodologies of the present disclosure.

As discussed herein, terms referencing direction, such as top, bottom, vertical, horizontal, side, left, right, front, back, etc., are used for convenience to describe embodiments of waveguide structures having a base or substrate extending in a horizontal plane. Embodiments of the present disclosure are not limited by these directional references and it is contemplated that a photonic integrated circuit and device structures in accordance with the present disclosure could be used in any orientation.

Example Structures

FIG. 1 illustrates a top view of part of a photonics integrated circuit (PIC) 100, in accordance with an embodiment of the present disclosure. In this example, the PIC 100 includes a first waveguide 110 and a second waveguide 120, each of which is coupled to a multimode interferometer (MMI) 130, also known as a multimode coupler. Part of the first waveguide 110 includes a first cladding 122. A second cladding 124 is over remaining portions of the first waveguide 110 and over the second waveguide 120. The first and second claddings 122, 124 differ in the refractive index, n. In some embodiments, the first waveguide 110 is a high-loss or tunable waveguide and the second waveguide 120 is a low-loss waveguide.

Figure 2:
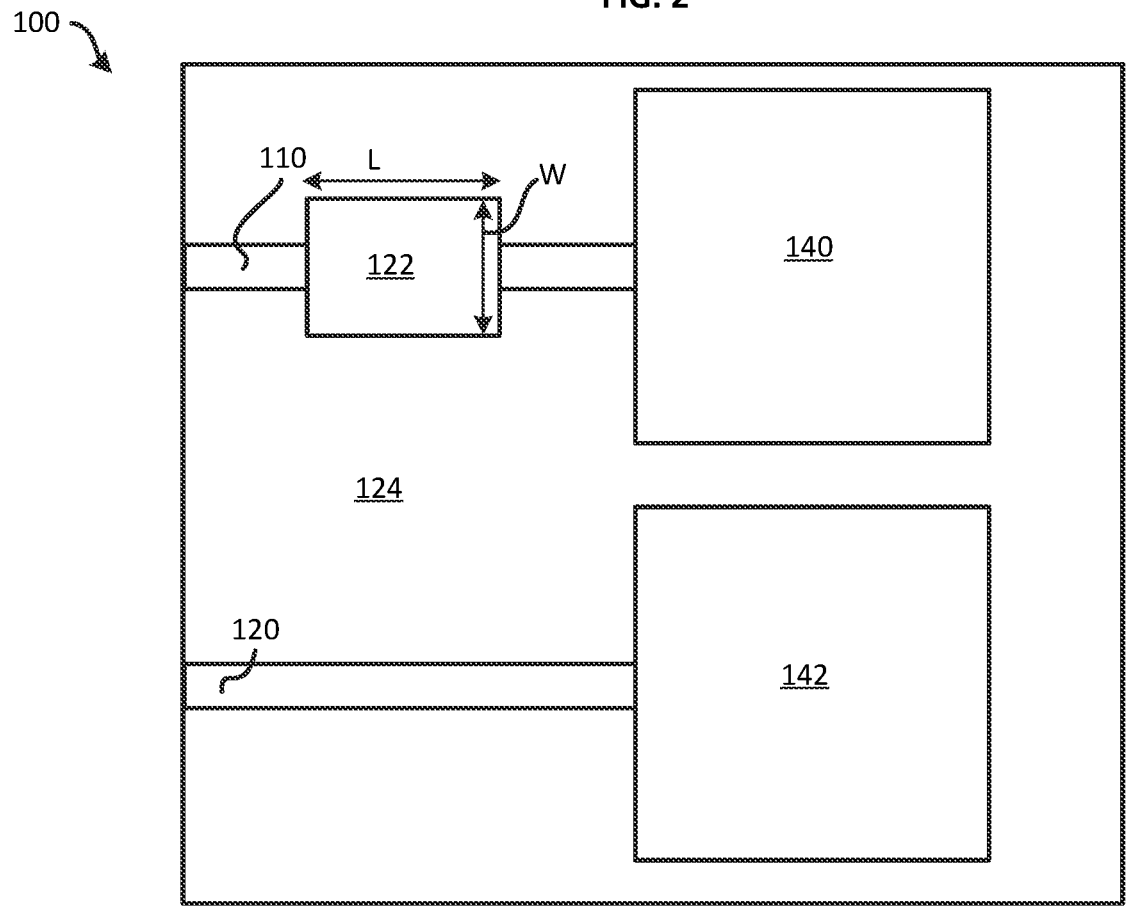
FIG. 2 is a top view of a tunable waveguide structure that includes waveguides coupled to photodetectors, in accordance with an embodiment of the present disclosure.

FIG. 2 illustrates a top view of part of a photonics integrated circuit (PIC) 100, in accordance with another embodiment of the present disclosure. Similar to the example of FIG. 1, the PIC 100 includes a first waveguide 110 and a second waveguide 120, where part of the first waveguide 110 includes a first cladding 122 and a second cladding 124 is over remaining portions of the first waveguide 110 and over the second waveguide 120. The first and second claddings 122, 124 differ in refractive index, n. In this example, the first waveguide 110 is coupled to a first photodetector 140 and the second waveguide 120 is coupled to a second photodetector 142. In some embodiments, the first and second photodetectors 140, 142 comprise a Group III-V semiconductor material.

In some embodiments of PIC 100, the first waveguide 110 and the second waveguide 120 are made of single crystal silicon, poly silicon, or silicon nitride (SiN). For example, the first and second waveguides 110, 120 can be formed as a rib on a layer of silicon. The first cladding 122 can be a hardmask oxide, such as annealed silicon dioxide ($SiO_2$). The second cladding 124 is also an oxide, such as silicon dioxide. Any oxide having a refractive index that is responsive to heat can be used for the first cladding 122. Without being bound to any particular theory, it is believed that the difference in refractive index n may result from a difference in crystal structure or a difference in the quality of the cladding material as a result of an annealing process. In one example, annealing at 400° C. for 5 hours results in a higher refractive index than annealing at 1100° C. for 5 minutes. It is believed that annealing at high temperatures (e.g., 1100° C.) improves crystal quality of an oxide and therefore lowers the refractive index. When the cladding is $SiO_2$, high temperature annealing is believed to improve $SiO_x$ quality, such as increasing density, repairing interface damage, or improving crystal structure. Thus, it has been observed that annealing an oxide cladding material at different temperatures and for different lengths of time can affect the refractive index n. This phenomenon can be used for in situ waveguide loss tuning.

The first cladding 122 has a width W that is large enough to cover the lateral width of the first waveguide 110. In some embodiments, the width W is typically about 1-2 μm. The first cladding 122 can have a length L suitable for a particular application, but is typically from several microns to tens of microns, including 1-100 μm, 5-80 μm, 5-60 μm, 5-50 μm, 5-40 μm, 5-20 μm, 10-80 μm, 10-60 μm, 10-40 μm, 10-30 μm, and 10-20 μm. The first and second waveguides 110, 120 are not limited to use with a MMI or photodetector and can be part of other photonics integrated circuits 100.

Figure 3:
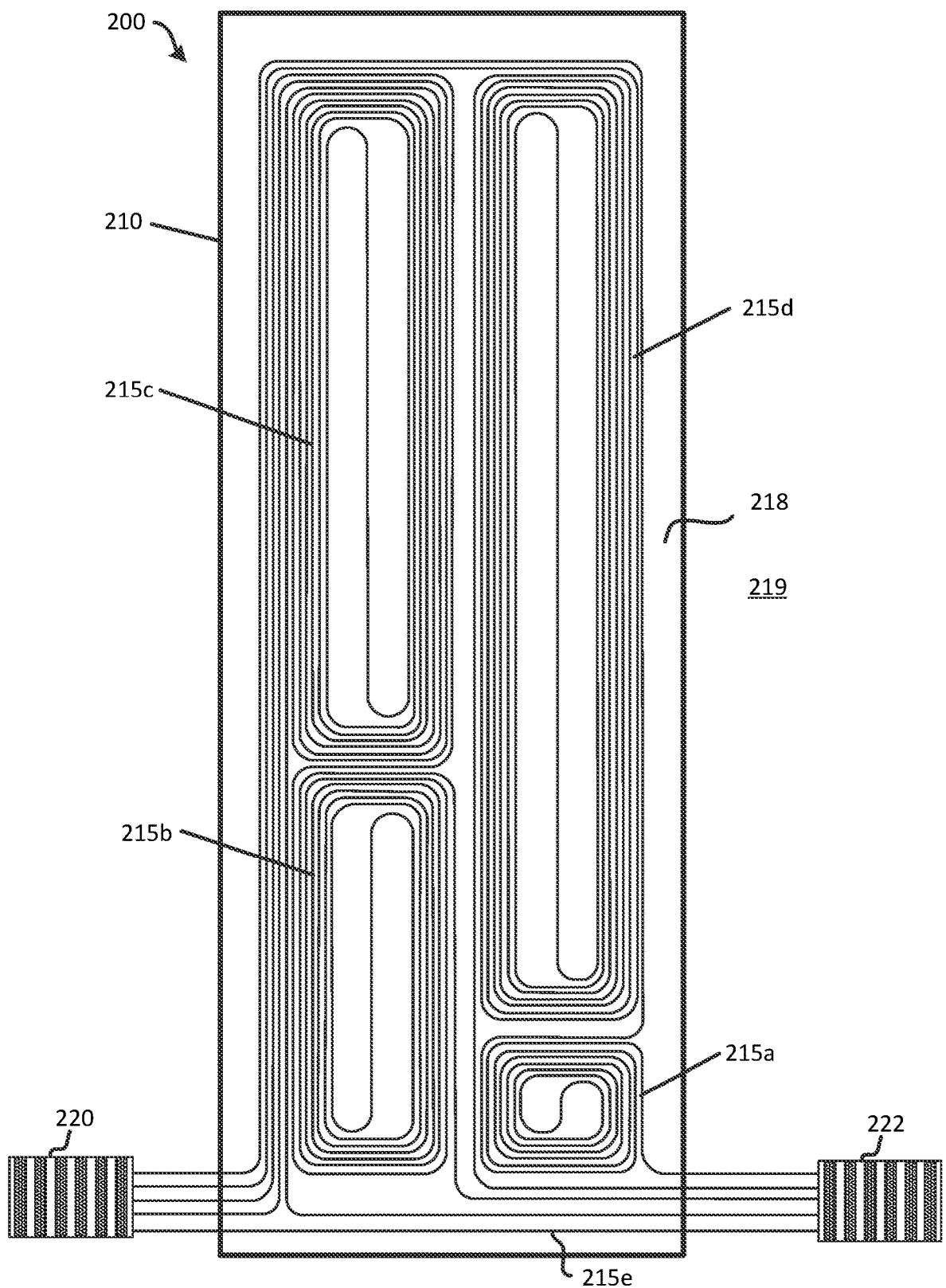
FIG. 3 is a top view of a photonics test circuit that includes waveguides having a spiral configuration, in accordance with an embodiment of the present disclosure.

FIG. 3 illustrates a top view of a test structure 200 useful for tuning waveguide losses, in accordance with an embodiment of the present disclosure. The test structure 200 includes a pool region 210 that is recessed with respect to the surrounding dielectric material by an amount from 2-20 μm, including 5-10 μm. Waveguides 215 of different lengths are formed as ribs on the semiconductor material (e.g., silicon) in the pool region 210. The pool region 210 is filled partially with a first cladding material (or in-pool cladding 218), such as $SiO_2$, to cover the waveguides 215. The first cladding material 218 is annealed according to loss tuning needs. In this example, the test structure 200 includes four waveguides 215a-215d each of which has a spiral geometry, in addition to one waveguide 215e configured as a linear path through the pool region between input coupler 220 and output coupler 222. Input coupler 220 and output coupler 222 are configured as grating couplers in this example.

In the example shown in FIG. 3, each of waveguides 215a-215d has a path similar to a string that has been folded in half, then wrapped into a coil, where the midpoint of the path is approximately at the middle of the coil. Such a configuration enables the input and output arms of the path to extend away from the coil to the input coupler 220 and output coupler 222, respectively. Waveguide 215a has a first length, waveguide 215b has a second length greater than the first length, waveguide 215c has a third length greater than the first and second lengths, and waveguide 215d has a fourth length greater than any of the first, second, and third lengths. In one embodiment, the second length is 2× that of the first length, the third length is 4× that of the first length, and the fourth length is 6× that of the first length. The length of waveguides 215 can be selected to have any desired ratio. Each waveguide typically has a path length from 10,000 to 100,000 microns, in accordance with some embodiments.

Waveguide loss (dB/cm) can be determined using equation 1, below, where the numbers 1 and 2 identify any two waveguides of different length L, where L2>L1:

$$WG\ loss = (WG\ loss\ 2 - WG\ loss\ 1)/(L2-L1) \quad (1)$$

Experimental data is presented in the table below for one waveguide of the test structure having a rib geometry and a width of several hundred microns. As evidenced by the data below, waveguide loss can be reduced by using a high temperature anneal compared to a low temperature anneal or no anneal.

| Anneal Condition | WG loss (dB/cm) | Normalized loss |
|---|---|---|
| As deposited (no anneal) | 1.8 | 1.0 |
| 400° C. to 500° C. for several hours | 1.2 | 0.67 |
| Above 1000° C. for 5 seconds to 5 minutes | 0.7 | 0.38 |

Figure 4:
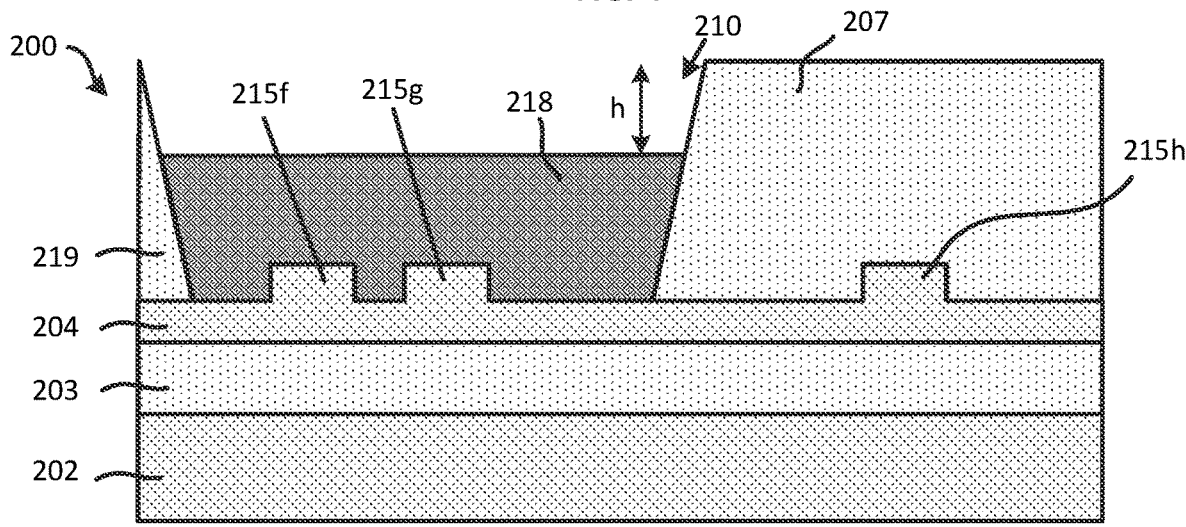
FIG. 4 is a cross-sectional view of part of a test structure and shows waveguides in a pool region and a waveguide in an out-of-pool region, in accordance with an embodiment of the present disclosure.

FIG. 4 illustrates a cross-sectional view of part of a test structure 200, in accordance with an embodiment of the present disclosure. In this example, the test structure 200 is on a base 202, such as a bulk silicon wafer. An oxide layer 203, such as $SiO_2$, is on the base 202 and is sandwiched between the base 202 and a layer of semiconductor material 204 on the oxide layer 203. The layer of semiconductor material 204 includes waveguides 215f, 215g, 215h having a rib geometry.

One or more layers of dielectric material 207 are on the layer of semiconductor material 204, such as $SiO_2$ of different crystal quality. The layer(s) of dielectric material 207 have been etched or otherwise recessed down to the semiconductor material 204 to define pool region 210. Stated differently, sides of the pool region 210 are defined by the dielectric material 207. Waveguides 215f and 215g are in-pool waveguides as being located in the pool region 210. In-pool waveguides 215f, 215g are covered by a first cladding 218 or in-pool cladding. Waveguide 215h is an out-of-pool waveguide as being located outside of the pool region 210. For example, the first cladding 218 can be $SiO_2$, including a hardmask oxide, an annealed hardmask oxide, or a high-quality cladding oxide, to name a few examples. Note that the first cladding 218 has a height difference h on the order of microns (e.g., 1-5 μm) with respect to the dielectric material 207.

During use of the test structure 200, waveguide losses can be measured at several stages, in accordance with some embodiments. Waveguide losses can be determined with the first cladding 218 as a hardmask oxide ($SiO_2$) in an as-deposited condition without anneal. The hardmask oxide is generally a low-quality oxide that results in higher waveguide loss. A second measurement of waveguide losses can be taken after annealing the hardmask oxide. After removing the hardmask oxide and replacing with a high-quality $SiO_2$ cladding oxide, a third measurement of waveguide losses can be obtained.

Figure 5:
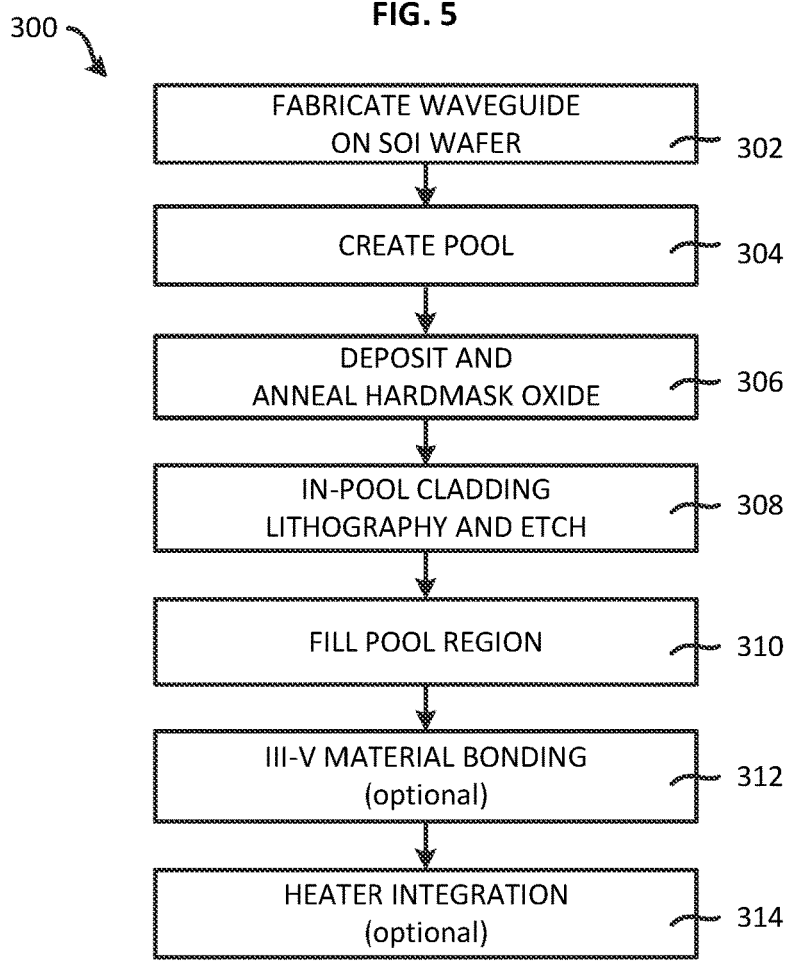
FIG. 5 illustrates processes in a method of fabricating a tunable waveguide, in accordance with an embodiment of the present disclosure.

FIG. 5 illustrates a method 300 of fabricating a tunable waveguide structure 201, in accordance with an embodiment of the present disclosure. Processes of method 300 are discussed concurrently with FIGS. 6A-6G, which illustrate cross-sectional views of an example test structure 200 at various stages of fabrication. Note that the processes in method 300 are shown in a particular order for ease of description. However, one or more of the processes may be performed in a different order or may not be performed at all (and thus be optional), in accordance with some embodiments.

Processes in method 300 can be performed using any suitable techniques, including but not limited to, masking, patterning, lithography, and/or etching processes (e.g., wet and/or dry etching). Etch processing may include one or more of chemical wet or dry etch, reactive ion etch (ME), deep reactive ion etch (DRIE), fast atom beam etch (FAB), and plasma etch (PE) to name a few examples. Material can be deposited using any suitable process, including atomic layer deposition (ALD), chemical vapor deposition (CVD), physical vapor deposition (PVD), epitaxial growth, or combinations of these processes, to name a few examples. In some embodiments, the structure can be planarized using chemical-mechanical polishing (CMP). Numerous variations on method 300 and the techniques described herein will be apparent in light of this disclosure.

Method 300 begins with fabricating 302 waveguides. In one embodiment, fabricating 302 waveguides includes providing a semiconductor on insulator (SOI) structure, where an insulator or dielectric material (e.g., an oxide, such as silicon dioxide) is sandwiched between two semiconductor layers, such as a buried oxide (BOX) structure. The top semiconductor layer 204 is patterned and etched to define waveguides having a rib structure. In some embodiments, the waveguides have a vertical (height) dimension from 100-500 nm and a lateral (width) dimension from 400-1200 nm. One or more layers of dielectric material (e.g., $SiO_2$) are then deposited onto the waveguides and semiconductor layer 204. This dielectric material can be the out-of-pool cladding, in some embodiments.

Figure 6A:
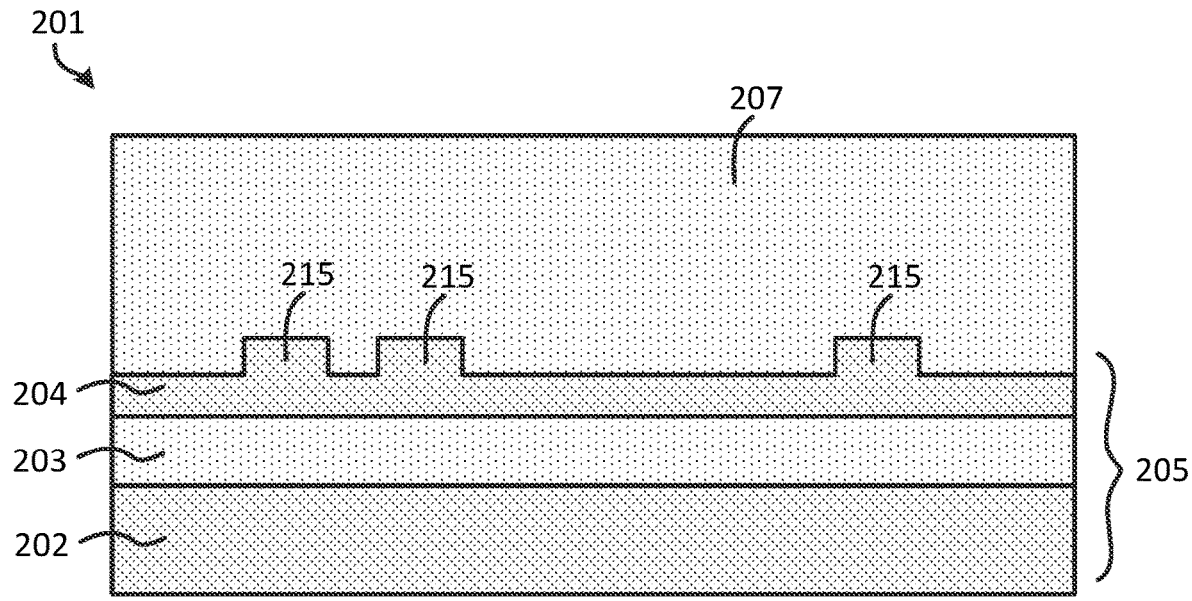
FIGS. 6A-6F illustrate cross-sectional view of a tunable waveguide assembly at various stages of fabrication, in accordance with some embodiments of the present disclosure.

In some such embodiments, such as shown in FIG. 6A, the SOI structure 205 includes a silicon dioxide layer 203 on a base 202 of silicon. A layer of semiconductor material 204 (e.g., monocrystalline silicon) is on the silicon dioxide layer 203. One or more layers of dielectric 207 covers the waveguides 215 and semiconductor material 204.

In some embodiments, the base 202 is a bulk wafer, such as monocrystalline silicon, germanium, silicon carbide (SiC), gallium nitride (GaN), and gallium arsenide (GaAs) to name a few examples. The semiconductor material 204 can be selected in some embodiments from Group III-V materials and/or Group IV materials. Further, the base 202 can comprise a semiconductor layer deposited or grown on, or transferred to, a structural substrate, such as silicon carbide layer epitaxially grown on a sapphire substrate. As will be appreciated, the thickness of the base 202 (or the semiconductor layer(s) of the base 202, as the case may be) can be any thickness suitable for the devices to be fabricated thereon.

Method 300 continues with defining 304 a pool region in the dielectric material, where the pool region includes a partial length of some of the waveguides. Defining 304 the pool region can be performed by patterning and etching the dielectric layer to define an opening to the semiconductor material. In one embodiment, etching is performed using a dry etch process, such as a reactive ion etch process. The pool region generally has a size (as viewed from a top view) to accommodate bonding a chip of III-V material. In one example, the pool region has a depth of 5-10 μm and a lateral dimension in the millimeter range, in some embodiments. The pool region may be referred to as a fake pool region since a III-V material may or may not be bonded over the pool region.

Figure 6B:
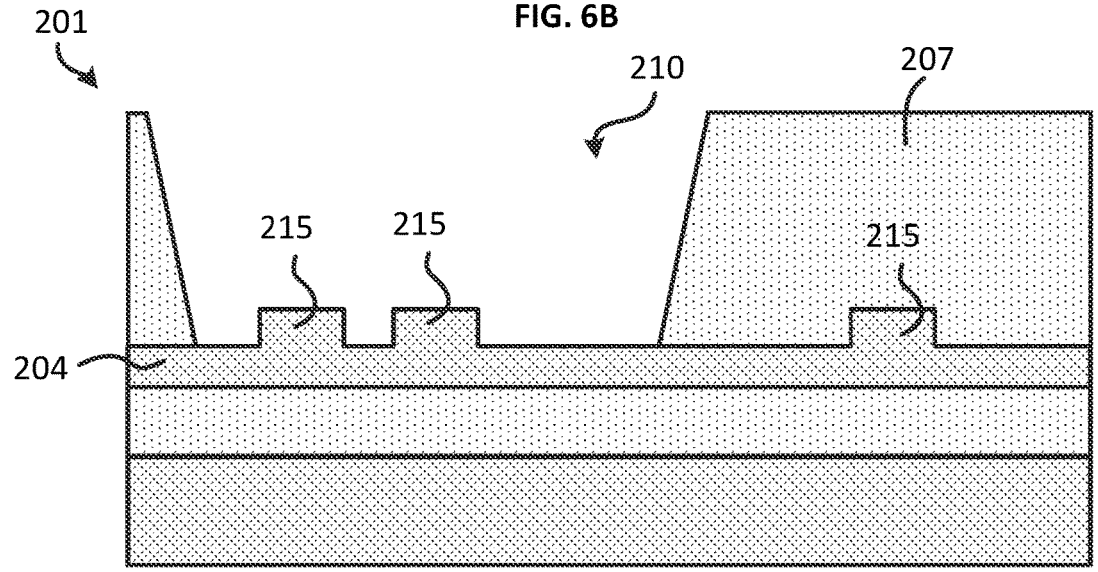

FIG. 6B illustrates an example of a tunable waveguide structure 201 after defining 304 the pool region 210 in the dielectric material 207. Note that the layer of semiconductor material 204 and some waveguides 215 are exposed in the pool region 210 at this stage of processing. In this example, one waveguide 215 remains covered by the dielectric material 207.

Method 300 continues with depositing 306 a first cladding material in the pool region, which includes covering the exposed waveguides with the first cladding material. In some embodiments, the first cladding material is a hardmask oxide. For example, a hardmask oxide is deposited in the pool region through a mask opening, followed by annealing to result in annealed hardmask oxide. As a result of the deposition process, the first cladding material typically exhibits a difference in height h compared to the surrounding dielectric material 207. The temperature and length of the anneal can affect the refractive index of the first cladding material, where generally a more dramatic change in refractive index is observed from high-temperature annealing. For example, annealing $SiO_2$ for several seconds or several minutes at a temperature above 1000° C. results in a more significant change (e.g., reduction) to the refractive index while annealing at 400° C.-500° C. for several hours results in a less significant change to the refractive index. In one embodiment, the hardmask oxide is silicon dioxide, which has a refractive index from 1.55 to 1.40 for some wavelengths of light.

Figure 6C:
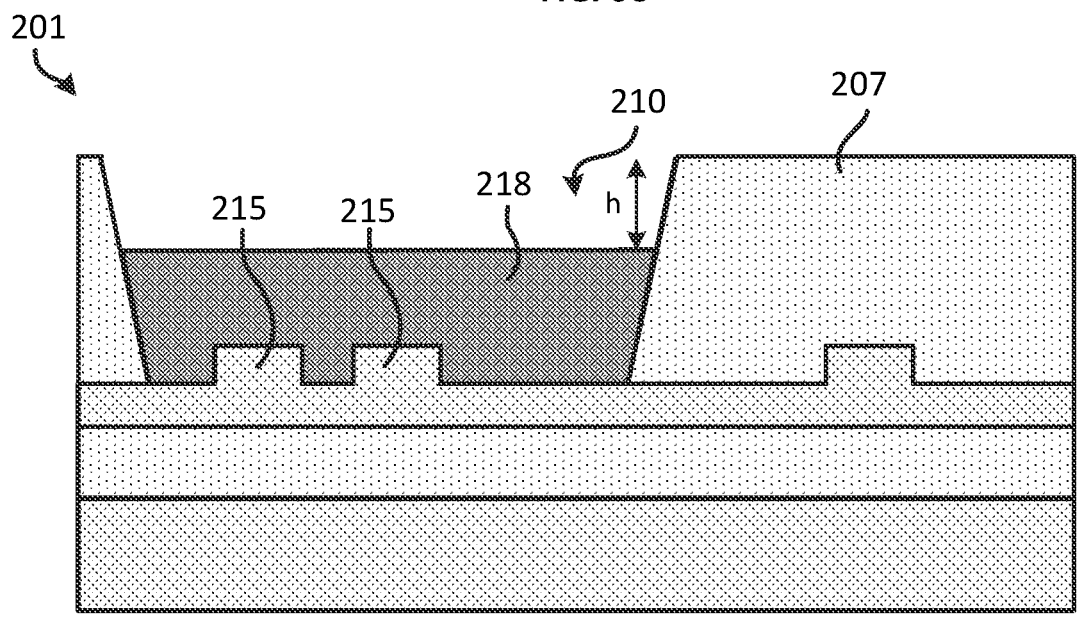

FIG. 6C illustrates the tunable waveguide structure 201 of FIG. 6B after depositing a first cladding material 218, such as a hardmask silicon dioxide, in the pool region 210. Note that the first cladding material 218 partially fills the pool region 210 and covers the waveguides 215 in the pool region 210.

Figure 6D:
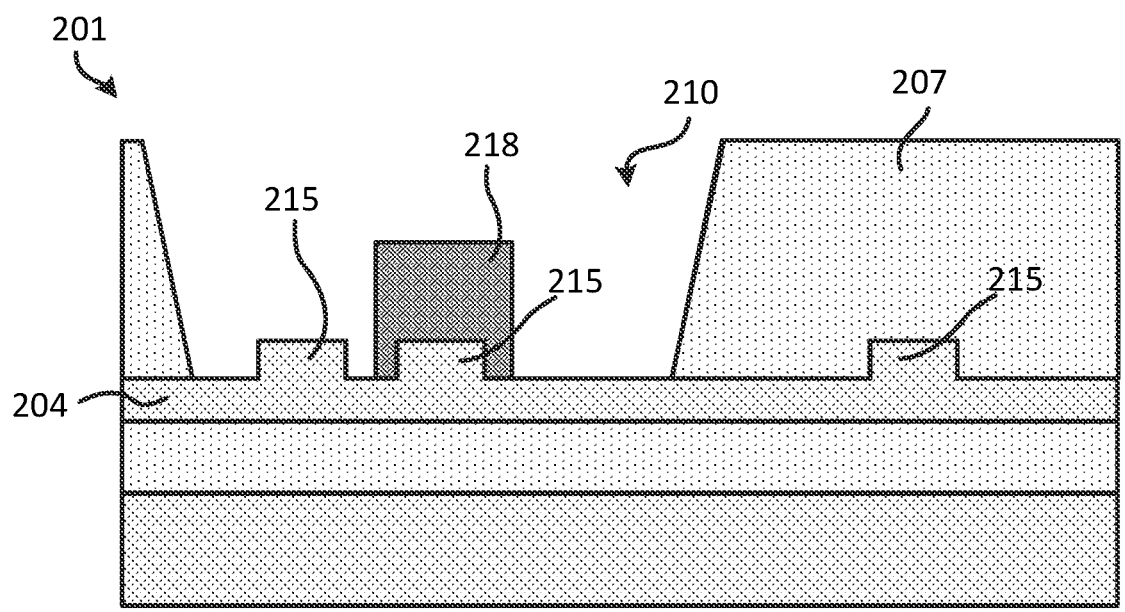

Method 300 continues with patterning and etching 308 the first cladding 218 to result in selected waveguide(s) 215 being clad with the first cladding 218. In one embodiment, the first cladding 218 is etched so that it clads one or more desired waveguides 215 in the pool region 210. In the example of FIG. 6D, the first cladding 218 has been etched to be over only one of the waveguides 215 in the pool region 210, removing it from the other waveguide and from the semiconductor material 204 forming the floor of the pool region 210. Typically, the first cladding 218 has a width so that is extends beyond each side of the waveguide 215 by about 500 nm. Also, the first cladding 218 is typically spaced from the adjacent dielectric material 207 by several hundred nanometers.

Figure 6E:
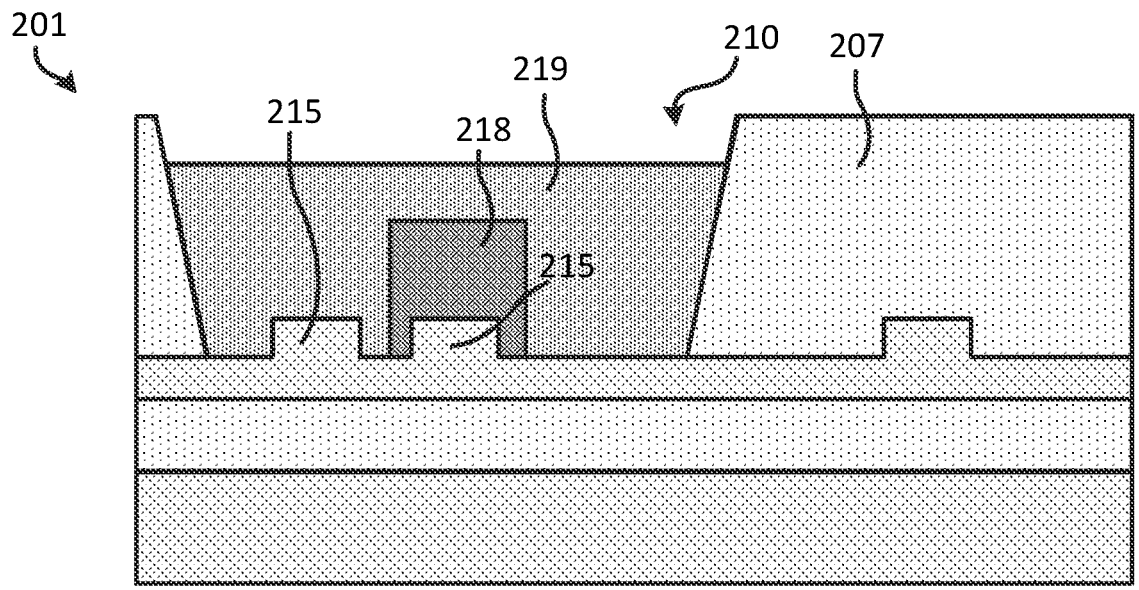

Method 300 continues with partially filling 310 the pool region with a second cladding material 219 that is different from the first cladding material 218. As shown in FIG. 6E, for example, a second cladding 219 has been deposited into the pool region 210, partially filling the pool region 210 and covering the first cladding material 218 and other exposed features in the pool region 210. The top surface of the second cladding material 219 has a height difference of several microns as compared to the adjacent dielectric 207. In accordance with some embodiments, the second cladding material 219 is selected to have a different refractive index that that of the first cladding material 218. This difference can be accomplished, for example, when the first cladding material 218 is a hardmask oxide and the second cladding material 219 is a high-quality cladding oxide, both of which can be $SiO_x$.

Method 300 optionally continues with bonding 312 III-V material over a portion of the waveguide(s) for use as a photodetector or other device. Process 312 can include multiple sub-processes, including surface preparation, bonding of III-V material, and patterning, as will be appreciated. The pool region 210 typically does not have III-V material over it, so the results of process 312 are not illustrated in this example.

Method 300 optionally continues with fabricating 314 a heater on the first cladding material. In one embodiment, fabricating 314 the heater includes etching a recess into a top of the first cladding material and depositing a liner of titanium nitride (TiN) or other suitable conductive material in the recess and along sidewalls of the recess. The liner can be deposited using atomic layer deposition or other suitable deposition process. Process 314 further includes filling the pool region 210 with a dielectric material (e.g., $SiO_2$), thereby covering the second cladding material, then patterning and etching the dielectric material to define one or more electrode openings. Metal or other suitable conductor is then deposited into the openings to define electrodes in contact with the liner. For example, the electrodes can be aluminum.

Figure 6F:
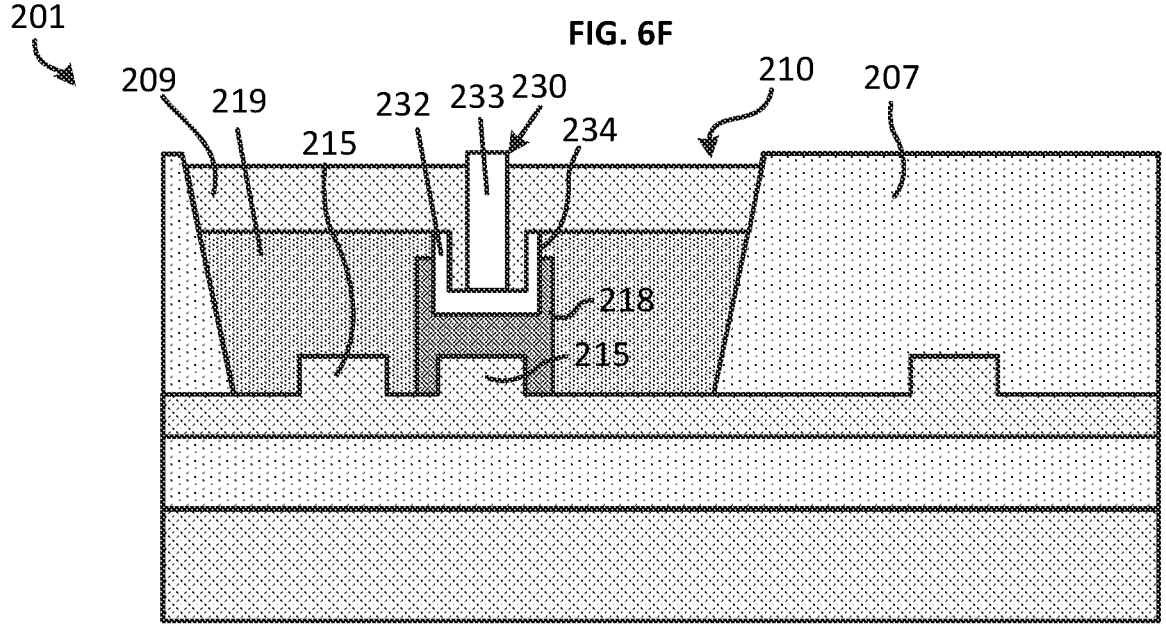

FIG. 6F illustrates a tunable waveguide structure 201 that includes a heater 230 recessed into a top of the first cladding 218. The heater 230 includes a liner 232 along the bottom and sides of the recess 234 that extends through the dielectric 209 and into the top of the first cladding 218. Metal electrodes 233 extend through the dielectric 209 to contact the liner 232 and are exposed at their upper ends for making electrical contact with a power source. Although only one electrode 233 is visible in FIG. 6F, the heater 230 typically includes a pair of electrodes 233 spaced along the length of the liner 232. Note that the dielectric 209 occupies the space between the electrodes 232 and the liner 230 at the lower portion of the electrode 232. Power can be applied to the electrodes 232 to heat the liner 232, and therefore the first cladding 218. In some embodiments, the first cladding 218 can be a photoinduced refractive index increase (PRI) material. Accordingly, as a result of heating the first cladding 218, the refractive index increases. This phenomenon can be used to tune waveguide losses, as will be appreciated.

Figure 6G:
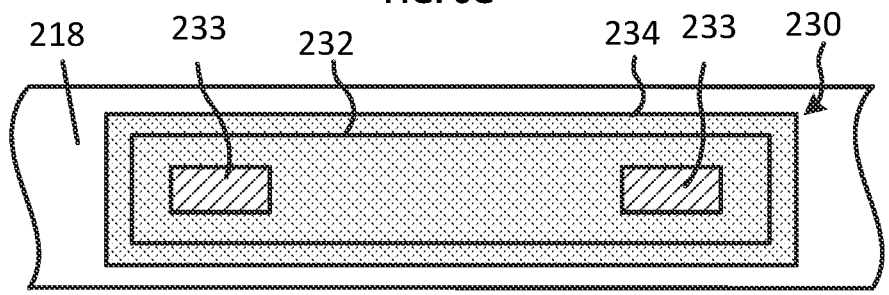
FIG. 6G illustrates a top view of a heater on waveguide cladding material, in accordance with an embodiment of the present disclosure.

FIG. 6G illustrates a top view of a heater 230 recessed into a top of first cladding 218, in accordance with an embodiment of the present disclosure. The surrounding dielectric material 209, waveguide 215, and other features are not shown for clarity purposes. In this example, the liner 232 has an elongated rectangular shape that extends along part of the first cladding 218. Material of the liner 232 is on the bottom and sidewalls of the recess 234. Spaced-apart electrodes 233 contact the floor of the liner 232 and are positioned for electrical contact to a power source. Applying power to the electrodes 233 heats the liner 232. Due to being recessed into or otherwise in contact with the first cladding 218, the heated liner 232 can heat the first cladding 218 to change the refractive index, and in turn tune waveguide losses.

Figure 7:
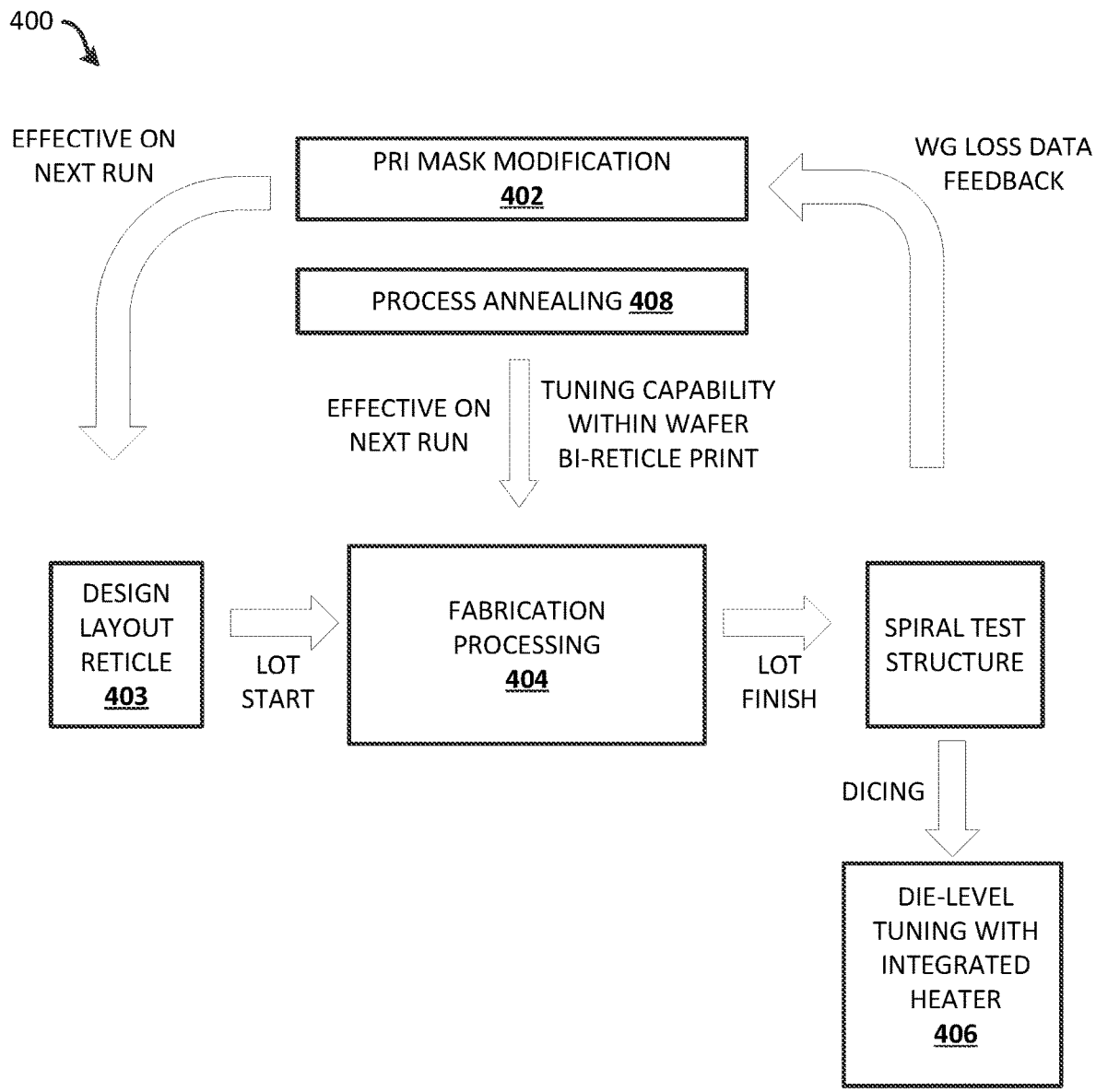
FIG. 7 is a flow diagram for tuning a waveguide assembly, in accordance with some embodiments of the present disclosure.

Referring now to FIG. 7, a process flow illustrates a method 400 of tuning waveguide loss, in accordance with some embodiments of the present disclosure. As discussed above, waveguide loss tuning can be performed at various stages of fabrication.

In one embodiment, tuning can be performed at least in part prior to fabrication 404 of a photonics integrated circuit, such as at mask modification 402 and/or reticle design 403 for PIR oxide cladding. For example, a mask can be modified to change a dimension (e.g., width or length) of the first cladding material. For example, increasing the cladding length results in increased waveguide loss; reducing the cladding width results in reduced waveguide loss, in accordance with some embodiments. Such tuning would be effective on the next fabrication run. Modifying the PIR oxide mask is less expensive than modifying a waveguide layout mask, in some embodiments.

In another embodiment, waveguide loss tuning can occur after dicing a PIC wafer by application 406 of an integrated heater, such as illustrated in FIG. 6G. For example, to achieve the desired performance, such as a desired MMI splitter ratio, the first cladding can be heated to affect the refractive index. An integrated heater or localized laser heater can be used to tune the WG losses by adjusting the refractive index of the first cladding. This in situ approach to tuning typically is irreversible and provides an opportunity to improve device performance before a product is shipped, for example. Such an approach can be suitable to increase the yield of a low-yield product, and can provide flexibility for die-level waveguide loss tuning.

In another embodiment, waveguide loss tuning can occur at least in part at process annealing 408 that occurs prior to bonding III-V material to the PIC. Tuning at this stage of processing has shown to have a low risk for adverse effects on the overall process flow. In response to utilizing waveguide loss data from the test structure, the first cladding can be annealed differently (e.g., at a higher or lower temperature) to provide a different refractive index that is effective on the next fabrication run. This approach to waveguide loss tuning can be used to improve component yield. For example, adjacent arms of an MMI may show different WG loss due to process variation. Based on WG loss feedback, an appropriate annealing temperature can be selected to compensate for process variation and improve yield.

In use, waveguides having a first cladding and a second cladding can be used for waveguide loss tuning in a PIC. When the first and second claddings have different refractive indices, tuning can occur at various stages of fabrication for flexibility in fabrication and use of a PIC. Some example uses include a tunable MMI and a III-V photodetector for LiDAR applications. Additionally, a spiral test structure can be used as a feedback component to assist in waveguide loss tuning. Advantages of some embodiments of the present disclosure include the ability to tune an in-pool waveguide. Flexibility of being able to tune the waveguide at various stages of fabrication can increased yield, improve device tuning, and increase the options for waveguide routing. Some waveguide structures of the present disclosure are advantageous compared to existing tuning approaches by being cost effective and avoiding the need for a complex modulator in the PIC.

Example System

Figure 8:
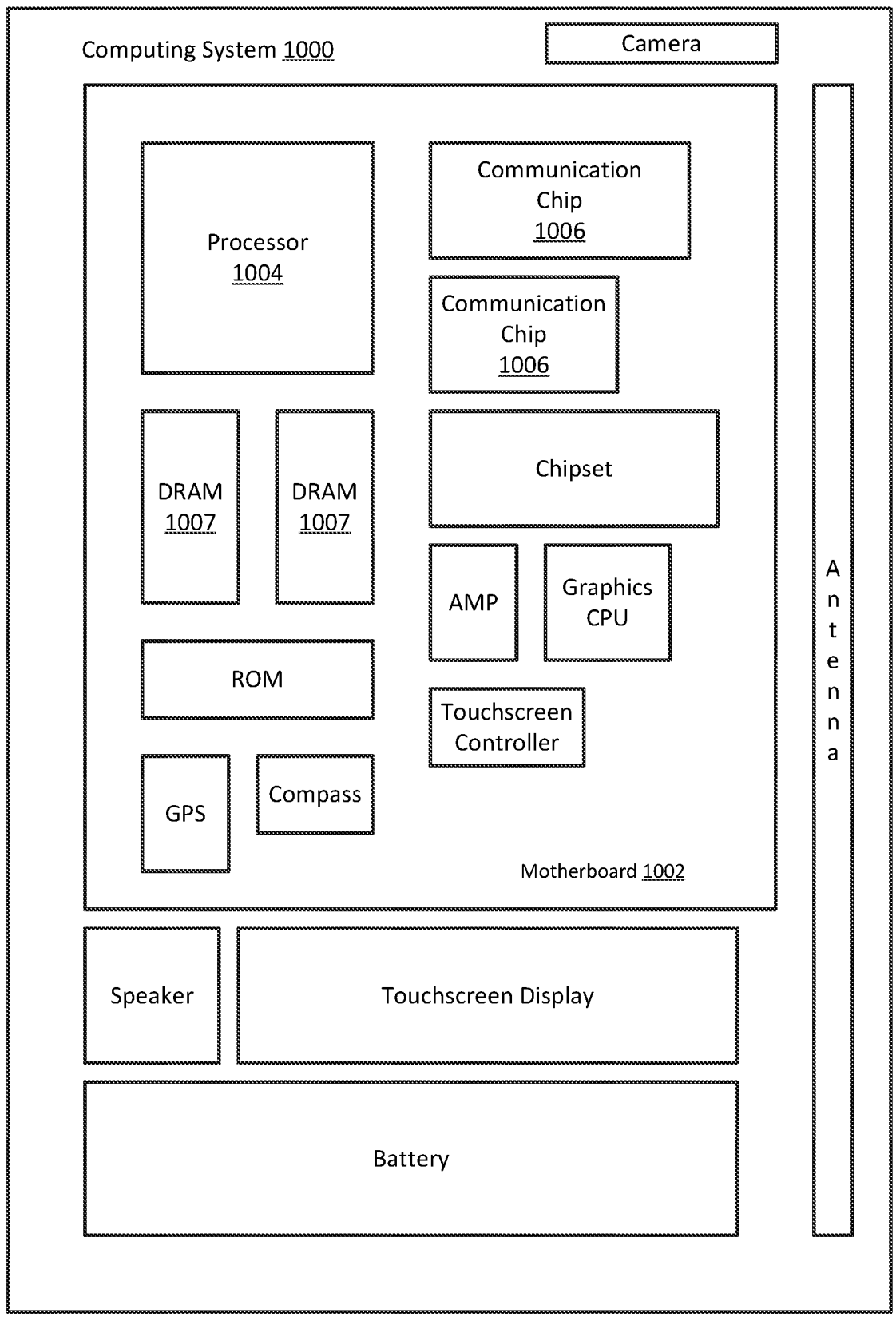
FIG. 8 illustrates a computing system including a tunable waveguide, in accordance of the present disclosure.

FIG. 8 is an example computing system implemented with one or more of the photonic integrated circuit structures as disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), a photodetector, a multimode interferometer, and so forth). Any of the components included in computing system 1000 may include one or more integrated circuit structures, photonic integrated circuit structures, or devices configured in accordance with an example embodiment (e.g., to include waveguides fabricated using a combination of different cladding materials as variously provided herein). In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, communication chip 1006 may include one or more transistor structures having a gate stack an access region polarization layer as variously described herein.

The processor 1004 of the computing system 1000 includes a photonics integrated circuit die packaged within the processor 1004. In some embodiments, the photonics integrated circuit die includes onboard circuitry that is implemented with one or more photonics integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, an ultra-mobile PC, a mobile phone, a desktop computer, a server, a printer, a scanner, a monitor, a set-top box, an entertainment control unit, a digital camera, a smart display, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit comprising a first waveguide, a portion of the first waveguide having a first cladding with a first refractive index; and a second waveguide having a second cladding with a second refractive index different from the first refractive index.

Example 2 includes the subject matter of Example 1, wherein both of the first cladding and the second cladding comprise silicon and oxygen.

Example 3 includes the subject matter any one of Examples 1 or 2, wherein the second cladding differs from the first cladding in crystal structure.

Example 4 includes the subject matter of any one of Examples 1-3, wherein the first cladding comprises a material exhibiting photoinduced refractive index increase.

Example 5 includes the subject matter of any one of Examples 1-4, further comprising a heater on the first cladding material.

Example 6 includes the subject matter of Example 5, wherein part of the heater is recessed into a top of the first cladding.

Example 7 includes the subject matter of Example 6, wherein the heater comprises a liner material on bottom and sidewalls of a recess in the first cladding and electrodes in contact with the liner material.

Example 8 includes the subject matter of Example 7, wherein the liner comprises titanium and nitrogen and the electrodes comprise aluminum.

Example 9 includes the subject matter of any one of Examples 1-8, further comprising a multimode coupler coupled to the first waveguide and to the second waveguide.

Example 10 includes the subject matter of any one of Examples 1-9, further comprising: a first photodetector coupled to the first waveguide, the first photodetector comprising a Group III-V semiconductor material; and a second photodetector coupled to the second waveguide, the second photodetector comprising a Group III-V semiconductor material.

Example 11 includes the subject matter of any one of Examples 1-10, wherein the first waveguide and the second waveguide are part of a first semiconductor layer, the integrated circuit further comprising an oxide layer and a base semiconductor layer wherein the oxide layer is between the base semiconductor layer and the first semiconductor layer.

Example 12 includes the subject matter of Example 11, wherein the first semiconductor layer comprises single crystal silicon, the oxide layer comprises silicon and oxygen, and the base semiconductor layer comprises silicon.

Example 13 includes the subject matter of any one of Examples 1-12, wherein the first cladding comprises silicon and oxygen.

Example 14 is an integrated circuit comprising a base of semiconductor material; an oxide material; a layer of semiconductor material on the oxide layer such that the oxide layer is between the base and the layer of semiconductor material, the layer of semiconductor material defining a plurality of waveguides including (i) a first waveguide, a portion of the first waveguide having a first cladding material with a first refractive index, and (ii) a second waveguide having a second cladding material with a second refractive index different from the first refractive index.

Example 15 includes the subject matter of Example 14, wherein the layer of semiconductor material comprises monocrystalline silicon.

Example 16 includes the subject matter of any one of Examples 14-15, further comprising a heater on the first cladding material wherein part of the heater is recessed into a top of the first cladding material.

Example 17 includes the subject matter of Example 16, wherein the heater comprises a liner material on bottom and sidewalls of a recess in the first cladding material, and electrodes in contact with the liner material.

Example 18 includes the subject matter of any one of Examples 14-17 and further comprises a multimode coupler coupled to the first waveguide and to the second waveguide.

Example 19 includes the subject matter of any one of Examples 14-18 and further comprises a first photodetector coupled to the first waveguide, the first photodetector comprising a Group III-V semiconductor material; and a second photodetector coupled to the second waveguide, the second photodetector comprising a Group III-V semiconductor material.

Example 20 is waveguide test circuit comprising a base of semiconductor material; an oxide layer; a layer of semiconductor material on the oxide layer such that the oxide layer is sandwiched between the base and the layer of semiconductor material, the layer of semiconductor material defining a plurality of waveguides, the plurality of waveguides including a first waveguide path of a first length and a second waveguide path of a second length greater than the first length; and a cladding material over the plurality of waveguides.

Example 21 includes the subject matter of Example 20 and further comprises a pool region defined in a dielectric material, the pool region including the first waveguide path and the second waveguide path, wherein the first cladding material is over the first waveguide path and the second waveguide path in the pool region.

Example 22 includes the subject matter of Example 20, wherein the plurality of waveguides further includes a third waveguide path of a third length greater than the second length and a fourth waveguide path of a fourth length greater than the third length.

Example 23 includes the subject matter of Examples 22 and further comprises a pool region defined in a dielectric material, the pool region including the first waveguide path, the second waveguide path, the third waveguide path, and the fourth waveguide path, wherein the first cladding material is over the first waveguide path, the second waveguide path, the third waveguide path, and the fourth waveguide path in the pool region.

Example 24 includes the subject matter of any one of Examples 20-23 and further comprises an input grating coupler and an output grating coupler adjacent the pool region, the input and output grating couplers coupled to the first waveguide, to the second waveguide, to the third waveguide, and to the fourth waveguide.

Example 25 includes the subject matter of any one of Examples 20-25, wherein the first waveguide path includes a first spiral and the second waveguide path includes a second spiral.

Example 26 includes the subject matter of any one of Examples 20-25, wherein each of the plurality of waveguides comprises a rib formed of the layer of semiconductor material, the rib having a width from 100-500 nm.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein

What is claimed is:

1. A photonic integrated circuit comprising: a first waveguide, a portion of the first waveguide having a first cladding with a first refractive index; a second waveguide having a second cladding with a second refractive index different from the first refractive index, wherein the first cladding is not on or over any portion of the second waveguide; a heater, wherein at least part of the heater is recessed into a top of the first cladding, and wherein the heater comprises a liner material on bottom and sidewalls of a recess in the first cladding, and electrodes in contact with the liner material.

2. The photonic integrated circuit of claim 1, wherein both of the first cladding and the second cladding comprise silicon and oxygen.

3. The photonic integrated circuit of claim 1, wherein the first cladding comprises a material exhibiting photoinduced refractive index increase.

4. The photonic integrated circuit of claim 1, wherein the liner comprises titanium and nitrogen and the electrodes comprise aluminum.

5. The photonic integrated circuit of claim 1, further comprising a multimode coupler coupled to the first waveguide and to the second waveguide.

6. The photonic integrated circuit of claim 1, further comprising:
   a first photodetector coupled to the first waveguide, the first photodetector comprising a Group III-V semiconductor material; and
   a second photodetector coupled to the second waveguide, the second photodetector comprising a Group III-V semiconductor material.

7. The photonic integrated circuit of claim 1, wherein the first waveguide and the second waveguide are part of a first semiconductor layer, the photonic integrated circuit further comprising an oxide layer and a base semiconductor layer wherein the oxide layer is between the base semiconductor layer and the first semiconductor layer.

8. The photonic integrated circuit of claim 7, wherein the first semiconductor layer comprises single crystal silicon, the oxide layer comprises silicon and oxygen, and the base semiconductor layer comprises silicon.

9. The photonic integrated circuit of claim 1, further comprising a third waveguide having a third cladding material directly on the third waveguide, wherein the third cladding material is adjacent to the second cladding material.

10. A photonic integrated circuit comprising: a base of semiconductor material; an oxide material; a layer of semiconductor material on the oxide layer such that the oxide layer is between the base and the layer of semiconductor material, the layer of semiconductor material defining a plurality of waveguides including (i) a first waveguide, a portion of the first waveguide having a first cladding material directly on the first waveguide and having a first refractive index, and (ii) a second waveguide having a second cladding material directly on the second waveguide and having a second refractive index different from the first refractive index; a heater on the first cladding material, wherein at least part of the heater is recessed into a top of the first cladding material, and wherein the heater comprises a liner material on bottom and sidewalls of a recess in the first cladding, and electrodes in contact with the liner material.

11. The photonic integrated circuit of claim 10, wherein the layer of semiconductor material comprises monocrystalline silicon.

12. The photonic integrated circuit of claim 10, further comprising a multimode coupler coupled to the first waveguide and to the second waveguide.

13. The photonic integrated circuit of claim 10, further comprising:
   a first photodetector coupled to the first waveguide, the first photodetector comprising a Group III-V semiconductor material; and
   a second photodetector coupled to the second waveguide, the second photodetector comprising a Group III-V semiconductor material.

14. The photonic integrated circuit of claim 10, wherein the plurality of waveguides further include a third waveguide having a third cladding material directly on the third waveguide, wherein the third cladding material is adjacent to the second cladding material.

15. A photonic integrated circuit comprising: a first waveguide, wherein a first portion of the first waveguide has a first cladding with a first refractive index and a second portion of the first waveguide has a second cladding with a second refractive index different from the first refractive index; a second waveguide having the second cladding, wherein the first cladding is not on or over any portion of the second waveguide; a heater, wherein at least part of the heater is recessed into a top of the first cladding, and wherein the heater comprises a liner material on bottom and sidewalls of a recess in the first cladding, and electrodes in contact with the liner material.

16. The photonic integrated circuit of claim 15, wherein the first portion of the first waveguide is sandwiched between a second portion of the first waveguide and a third portion of the first waveguide, wherein each of the second and third portions of the first waveguide have the second cladding.

17. The photonic integrated circuit of claim 15, wherein both of the first cladding and the second cladding comprise silicon and oxygen.

18. The photonic integrated circuit of claim 15, further comprising a multimode coupler coupled to the first waveguide and to the second waveguide.

* * * * *